United States Patent
Cheng et al.

(10) Patent No.: US 9,209,198 B2
(45) Date of Patent: Dec. 8, 2015

(54) MEMORY CELL AND MANUFACTURING METHOD THEREOF

(71) Applicant: MACRONIX International Co., Ltd., Hsinchu (TW)

(72) Inventors: Chih-Chieh Cheng, Hsinchu (TW); Shih-Guei Yan, Hsinchu (TW); Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/275,559

(22) Filed: May 12, 2014

(65) Prior Publication Data

US 2015/0325584 A1 Nov. 12, 2015

(51) Int. Cl.
*H01L 27/115* (2006.01)
*H01L 29/792* (2006.01)
*H01L 29/66* (2006.01)

(52) U.S. Cl.
CPC .... *H01L 27/11568* (2013.01); *H01L 29/66833* (2013.01); *H01L 29/792* (2013.01)

(58) Field of Classification Search
CPC ............ H01L 27/11568; H01L 29/792; H01L 29/66833
See application file for complete search history.

(56) References Cited

U.S. PATENT DOCUMENTS

| | | | |
|---|---|---|---|
| 2009/0175089 A1* | 7/2009 | Eitan et al. | 365/185.28 |
| 2011/0207287 A1* | 8/2011 | Lee et al. | 438/424 |
| 2012/0056259 A1* | 3/2012 | Chen et al. | 257/324 |
| 2014/0097481 A1* | 4/2014 | La Rosa | H01L 29/788 257/315 |

* cited by examiner

Primary Examiner — Yasser A Abdelaziez
Assistant Examiner — Farun Lu
(74) Attorney, Agent, or Firm — J.C. Patents

(57) ABSTRACT

Provided is a memory cell including a substrate, two doped regions of a first conductivity type, one doped region of a second conductivity type, two stacked structures, and a first isolation structure. The doped regions of the first conductivity type are respectively disposed in the substrate. The doped region of the second conductivity type is disposed in the substrate between the two doped regions of the first conductivity type. The stacked structures are disposed on the substrate and respectively cover the corresponding doped regions of the first conductivity type and a portion of the doped region of the second conductivity type. Each of the stacked structures includes one charge storage layer. The first isolation structure completely covers and is in contact with the bottom surface of each of the doped regions of the first conductivity type and the bottom surface of the doped region of the second conductivity type.

18 Claims, 8 Drawing Sheets

MEMORY CELL AND MANUFACTURING METHOD THEREOF

BACKGROUND OF THE INVENTION

1. Field of the Invention

The invention is related to a memory cell and a manufacturing method thereof.

2. Description of Related Art

A memory is a semiconductor device designed for the purpose of storing information or data. As the functionalities of computer microprocessors become more and more powerful, programs and operations executed by software are increasing correspondingly. As a consequence, the demand for a memory is ever increasing. Among various memory devices, the non-volatile memory has the advantage of retaining stored data after being disconnected. Therefore, many electronic products require the non-volatile memory to maintain normal operation when the electronic products are turned on.

A typical non-volatile memory has a floating gate and a control gate fabricated by using doped polysilicon. As the memory is programmed, electrons injected into the floating gate can be uniformly distributed in the entire polysilicon floating gate. However, if the tunnel oxide layer under the polysilicon floating gate has a defect, a leakage current can be readily generated in the device and affect the reliability of the device.

Therefore, to solve the issue of current leakage in the non-volatile memory, one method utilizes a charge trapping layer to replace the polysilicon floating gate. An advantage of replacing the polysilicon floating gate with a charge trapping layer is that, when the device is programmed, the electrons are only stored in a portion of the charge trapping layer near the top of the source region or the drain region. The distribution pattern of the electrons in the charge trapping layer can be changed by changing the voltage applied to the control gate and the source region and the drain region on two sides, and the distribution pattern of the electrons in a single charge trapping layer can include two groups of electrons with a Gaussian distribution, a single group of electrons with a Gaussian distribution, or no electrons. Accordingly, the non-volatile memory having a charge trapping layer instead of a floating gate is a memory device capable of storing 2 bits per cell. Generally speaking, 2-bit data can be respectively stored on the left side (such as the left bit) or the right side (such as the right bit) of the charge trapping layer.

However, a flash memory may suffer from a second bit effect. That is, when a reading operation is performed on the left bit, the reading operation is affected by the right bit; or when the reading operation is performed on the right bit, the reading operation is affected by the left bit. In addition, the length of a channel is reduced as the memory is miniaturized, which makes the second bit effect more significant, thereby reducing the performance of the memory. Moreover, when the size of the memory is reduced, a spacing between the elements therein is shortened as well. As a result, program disturbance may readily occur and affect the reliability of the memory device when a programming operation is performed on a neighboring memory.

SUMMARY OF THE INVENTION

The embodiments of the invention provide a memory cell capable of reducing the generation of a second bit effect and program disturbance during operation.

The embodiments of the invention also provide a manufacturing method of a memory cell. The manufacturing method can be integrated with a current manufacturing process, and the manufactured memory cell can reduce the issues of the second bit effect and program disturbance.

The invention provides a memory cell including: a substrate, two doped regions of a first conductivity type, one doped region of a second conductivity type, two stacked structures, and a first isolation structure. The doped regions of the first conductivity type are respectively disposed in the substrate. The doped region of the second conductivity type is disposed in the substrate between the two doped regions of the first conductivity type. The stacked structures are disposed on the substrate and respectively cover the corresponding doped regions of the first conductivity type and a portion of the doped region of the second conductivity type. Each of the stacked structures includes a charge storage layer. The first isolation structure completely covers and is in contact with the bottom surface of each of the doped regions of the first conductivity type and the bottom surface of the doped region of the second conductivity type.

According to the embodiments of the invention, the memory cell further includes two second isolation structures located below the first isolation structure and respectively disposed in the substrate below the doped regions of the first conductivity type and at least a portion of the doped region of the second conductivity type.

According to the embodiments of the invention, the memory cell further includes a patterned gate conductor layer and a dielectric layer. The patterned gate conductor layer covers the surface and the sidewall of each of the stacked structures and the surface of the doped region of the second conductivity type. The dielectric layer is located between the patterned gate conductor layer and the stacked structures and between the patterned gate conductor layer and the doped region of the second conductivity type.

According to the embodiments of the invention, one of the two doped regions of the first conductivity type is used as a source region and the other one of the two doped regions of the first conductivity type is used as a drain region According to the embodiments of the invention, each of the charge trapping layers covering the portion of the doped region of the second conductivity type is used as a storage location According to the embodiments of the invention, each of the stacked structures comprises a first dielectric layer, the charge trapping layer, a second dielectric layer, from bottom to top.

According to the embodiments of the invention, each of the stacked structures further comprises a hard mask layer on the second dielectric layer The invention further provides a memory cell including: a substrate, two doped regions of a first conductivity type, one doped region of a second conductivity type, two stacked structures, and two isolation structures. The doped regions of the first conductivity type are respectively disposed in the substrate. The doped region of the second conductivity type is disposed in the substrate between the two doped regions of the first conductivity type. The two stacked structures are disposed on the substrate and respectively cover the corresponding doped regions of the first conductivity type and a portion of the doped region of the second conductivity type. Each of the stacked structures includes a charge storage layer. The two isolation structures are respectively disposed in the substrate and located below the doped regions of the first conductivity type and at least a portion of the doped region of the second conductivity type. Moreover, the isolation structures are in contact with the bottom surface of each of the doped regions of the first conductivity type and in contact with the bottom surface of at least a portion of the doped region of the second conductivity type.

According to the embodiments of the invention, the memory cell further includes a patterned gate conductor layer and a dielectric layer. The patterned gate conductor layer covers the surface and the sidewall of each of the stacked structures and the surface of the doped region of the second conductivity type. The dielectric layer is located between the patterned gate conductor layer and the stacked structures and between the patterned gate conductor layer and the doped region of the second conductivity type.

According to the embodiments of the invention, one of the two doped regions of the first conductivity type is used as a source region and the other one of the two doped regions of the first conductivity type is used as a drain region.

According to the embodiments of the invention, each of the charge trapping layers covering the portion of the doped region of the second conductivity type is used as a storage location.

According to the embodiments of the invention, each of the stacked structures comprises a first dielectric layer, the charge trapping layer, a second dielectric layer, from bottom to top.

According to the embodiments of the invention, each of the stacked structures further comprises a hard mask layer on the second dielectric layer.

The invention further provides a manufacturing method of a memory cell. The method includes the following steps: an isolation structure is formed on a substrate. A doped layer of a first conductivity type is formed on the isolation structure. Two stacked structures are formed on the doped layer of the first conductivity type. Each of the stacked structures includes a charge storage layer. A doped region of a second conductivity type is formed in the doped layer of the first conductivity type. The doped region of the second conductivity type divides the doped layer of the first conductivity type into two doped regions of the first conductivity type. The isolation structure is disposed in the substrate below the doped regions of the first conductivity type and at least a portion of the doped region of the second conductivity type. Moreover, the isolation structure is in contact with the bottom surface of each of the doped regions of the first conductivity type and in contact with the bottom surface of the doped region of the second conductivity type.

According to the embodiments of the invention, the step of forming the isolation structure on the substrate includes forming a first isolation structure such that the bottom surface of each of the doped regions of the first conductivity type and the bottom surface of the doped region of the second conductivity type are in contact with the first isolation structure.

According to the embodiments of the invention, the step of forming the isolation structure on the substrate further includes forming two second isolation structures corresponding to the doped regions of the first conductivity type and located in the substrate below the first isolation structure.

According to the embodiments of the invention, the isolation structure includes two first isolation structures corresponding to the doped regions of the first conductivity type.

According to the embodiments of the invention, the manufacturing method of the memory cell further includes the following steps: a gate conductor layer is formed, wherein the gate conductor layer covers the surface and the sidewall of each of the stacked structures and the surface of the doped region of the second conductivity type. A dielectric layer is formed, wherein the dielectric layer is located between the gate conductor layer and the stacked structures and between the gate conductor layer and the doped region of the second conductivity type.

According to the embodiments of the invention, the forming method of the isolation structure includes a chemical vapor deposition method, a thermal oxidation method, a shallow trench isolation method, or a combination thereof.

According to the embodiments of the invention, each of the two stacked structures comprises a first dielectric layer, the charge trapping layer, a second dielectric layer and a hard mask layer, from bottom to top.

Based on the above, in the memory cell of the invention, the isolation structure is formed in the substrate before the doped regions of the first conductivity type, the doped region of the second conductivity type, and the stacked structures are formed. The top surface of the isolation structure is in direct contact with the bottom surface of each of the doped regions of the first conductivity type and the bottom surface of the doped region of the second conductivity type, and therefore the travelling path of an electron from a charge trapping layer in the stacked structures to a charge trapping layer of an adjacent memory cell can be effectively blocked. As a result, program disturbance in the memory can be effectively prevented.

Moreover, since two storage locations of each of the memory cells are isolated from each other and the region for storage (also referred to as a capture region) is very small, the second bit effect can be reduced.

Moreover, the manufacturing process of the memory cell of the embodiments of the invention does not require an excess number of additional process steps and can be integrated with a current manufacturing process to manufacture a memory cell capable of reducing the issues of the second bit effect or program disturbance.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are schematic cross-sectional diagrams of a manufacturing process of a non-volatile memory device illustrated according to the first embodiment of the invention.

In the following, the first conductivity type is N-type and the second conductivity type is P-type for illustration. However, the invention is not limited thereto. Those having ordinary skill in the art should know that the first conductivity type can also be changed to P-type and the second conductivity type be changed to N-type. In particular, the N-type dopant is, for instance, phosphorous or arsenic, and the P-type dopant is, for instance, boron or boron difluoride ($BF_2$).

Figure 1A:
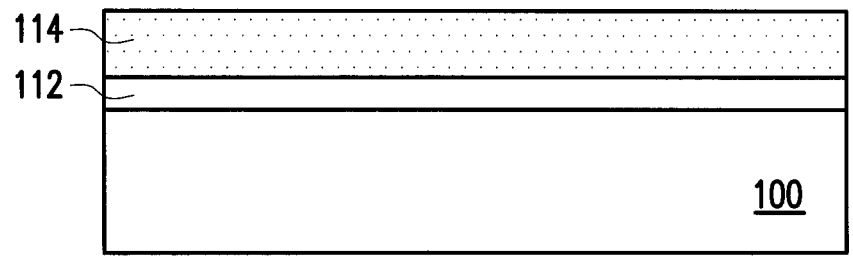
FIG. 1A to FIG. 1E are schematic cross-sectional diagrams of a manufacturing process of a non-volatile memory device illustrated according to the first embodiment of the invention.

First, referring to FIG. 1A, an isolation structure 112 is formed on a substrate 100. The substrate 100 can be formed by at least one semiconductor material selected from the group consisting of Si, Ge, SiGe, GaP, GaAs, SiC, SiGeC, InAs, and InP. The material of the isolation structure 112 is, for instance, any suitable material such as silicon oxide, silicon oxynitride, silicon carbide, or silicon carbon nitride. The forming method of the isolation structure 112 is, for instance, a chemical vapor deposition method. A thickness H1 of the isolation structure 112 is, for instance, 30 angstroms to 1000 angstroms. Then, a doped layer 114 of the first conductivity type is formed on the isolation structure 112. The doped layer 114 of the first conductivity type is, for instance, a doped polysilicon layer of the first conductivity type. The forming method of the doped layer 114 of the first conductivity type is, for instance, a chemical vapor deposition method.

Figure 1B:
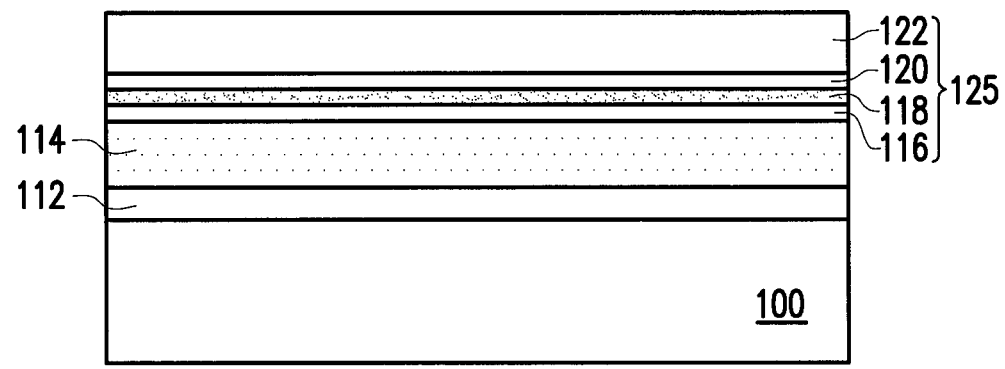

Then, referring to FIG. 1B, a stacked layer 125 is formed on the doped layer 114 of the first conductivity type. The stacked layer 125 includes a charge storage layer (also referred to as a charge trapping layer) 118. In an exemplary embodiment, the stacked layer 125 includes a dielectric layer 116, a charge trapping layer 118, a dielectric layer 120, and a hard mask layer 122. In another exemplary embodiment, the stacked layer 125 includes the dielectric layer 116, the charge trapping layer 118, and the dielectric layer 120, and does not include the hard mask layer 122. The material of each of the dielectric layer 116 and the dielectric layer 120 is, for instance, an oxide. The material of the charge trapping layer 118 is, for instance, a nitride or a high dielectric constant material (such as $HfO_2$, $TiO_2$, $ZrO_2$, $Ta_2O_5$, or $Al_2O_3$).

Figure 1C:
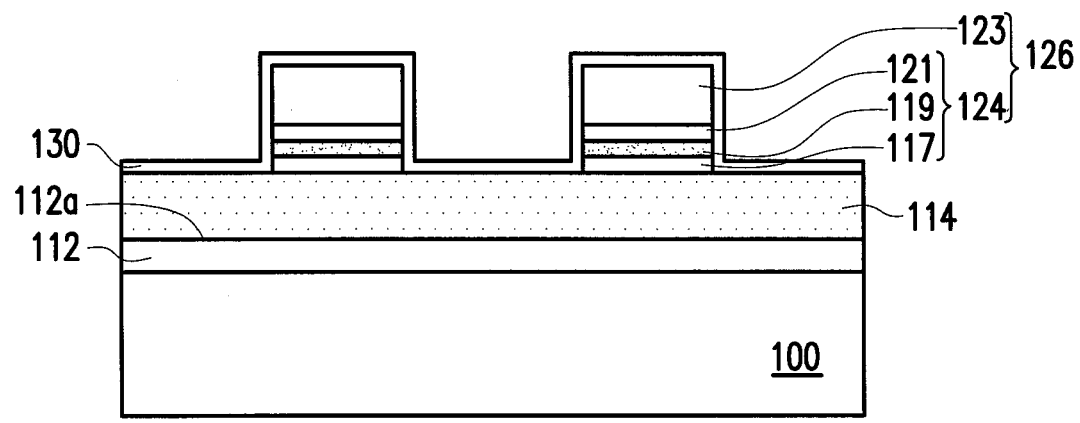

Next, referring to FIG. 1C, the stacked layer 125 is patterned to form stacked structures 126. More specifically, a patterned mask layer is formed on the hard mask layer 122. The patterned mask layer is, for instance, a patterned photoresist layer. Then, an etching process is performed by using the patterned mask layer as an etch mask to form the stacked structures 126. The etching process is, for instance, a dry etching process. Each of the formed stacked structures 126 includes a patterned hard mask layer 123 and a charge storage structure 124. The charge storage structure 124 includes a patterned dielectric layer 117, a patterned charge trapping layer 119, and a patterned dielectric layer 121. The dielectric layer 117 is used as a tunneling dielectric layer and the patterned dielectric layer 121 is used as a charge blocking layer. In another embodiment, the hard mask layer 122 is not formed on the dielectric layer 120, and therefore the formed stacked structures 126 do not include the hard mask layer 123.

Then, referring to FIG. 1C, a dielectric layer 130 is formed on the doped layer 114 of the first conductivity type and the stacked structures 126. The material of the dielectric layer 130 is, for instance, silicon oxide. The dielectric layer 130 can conformally cover the doped layer 114 of the first conductivity type and the stacked structures 126. The thickness of the dielectric layer 130 is, for instance, 30 to 200 angstroms. The forming method of the dielectric layer 130 is, for instance, a chemical vapor deposition method or an atomic layer deposition (ALD) method.

Figure 1D:
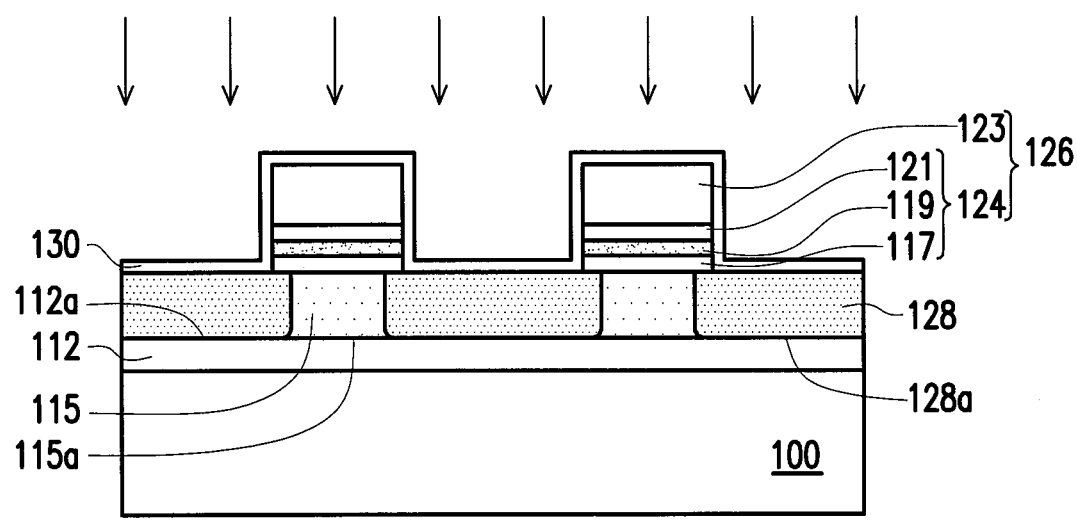

Then, referring to FIG. 1D, doped regions 128 of the second conductivity type are formed in the doped layer 114 of the first conductivity type. The forming method of the doped regions 128 of the second conductivity type includes, for instance, performing an ion implantation process on the substrate 100 to implant a dopant of the second conductivity type into the doped layer 114 of the first conductivity type, so as to form a plurality of doped regions 128 of the second conductivity type in the doped layer 114 of the first conductivity type. The doped regions 128 of the second conductivity type divide the doped layer 114 of the first conductivity type into a plurality of doped regions 115 of the first conductivity type separated from one another. The doped regions 115 of the first conductivity type are located below the corresponding stacked structures 126.

In the embodiment above, the dielectric layer 130 is formed first, and then the doped regions 128 of the second conductivity type are formed. However, the invention is not limited thereto. In another embodiment, an ion implantation process can be performed first to form the doped regions 128 of the second conductivity type, and then the dielectric layer 130 is formed.

Figure 1E:
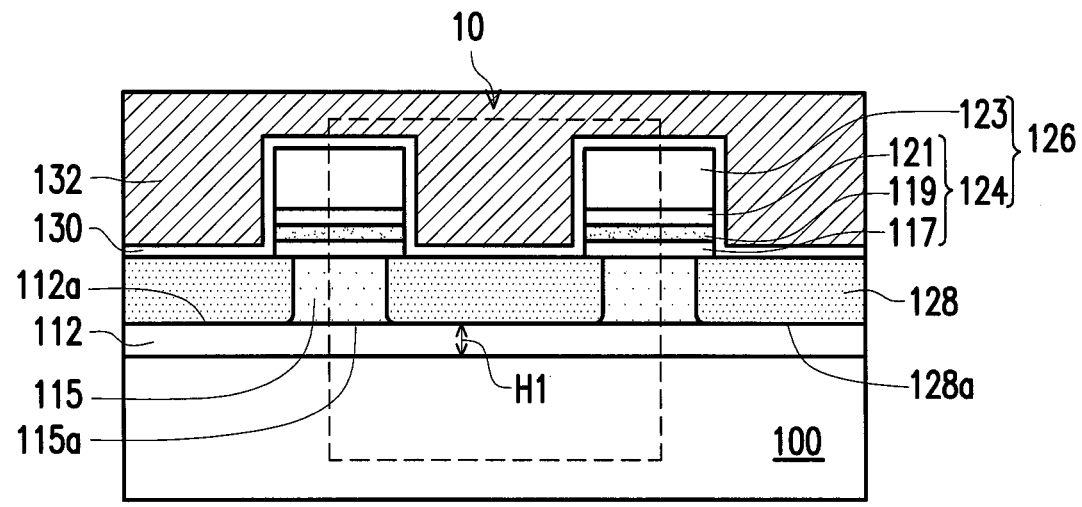

Then, referring to FIG. 1E, a patterned conductor layer 132 is formed on the substrate 100 to cover the stacked structures 126 and the dielectric layer 130 above the doped regions 128 of the second conductivity type. The forming method of the gate conductor layer 132 includes, for instance, forming a conductor material layer, and then patterning the conductor material layer. The material of the conductor material layer is, for instance, a doped polysilicon layer, and the forming method is, for instance, a chemical vapor deposition method. At this point, a memory cell 10 is formed on the substrate 100.

Referring to FIG. 1E, the memory cell 10 of the invention includes a plurality of memory cells 10 located on the substrate 100. Each of the memory cells 10 includes: a gate conductor layer 132, a dielectric layer 130, two stacked structures 126, two doped regions 115 of the first conductivity type, one doped region 128 of the second conductivity type, and one isolation structure 112. In an embodiment, the stacked structures 126, the doped regions 115 of the first conductivity type, and the doped region 128 of the second conductivity type are extended along a first direction. The patterned conductor layer 132 is extended along a second direction. The isolation structure 112 is on the plane formed by the first direction and the second direction, and the plane is, for instance, parallel to the surface of the substrate 100. The first direction and the second direction can be substantially perpendicular. In an embodiment, the first direction is the X direction and the second direction is the Y direction.

More specifically, the stacked structures 126 are extended along the first direction and are disposed on the substrate 100. Each of the stacked structures 126 includes a charge storage structure 124. The charge storage structure 124 can include a patterned dielectric layer 117, a patterned charge trapping layer 119, and a patterned dielectric layer 121. In an embodiment, each of the stacked structures 126 can further include a hard mask layer 123 located on the charge storage structure 124. In another embodiment, each of the stacked structures 126 can include the charge storage structure 124 but not include the hard mask layer 123. The stacked structures 126 cover the doped regions 115 of the first conductivity type and a portion of the doped region 128 of the second conductivity type on both sides of the doped regions 115 of the first conductivity type. In the stacked structures 126, the patterned charge trapping layer 119 covering the doped region 128 of the second conductivity type can be used as a storage location. Therefore, each of the memory cells 10 can contain two storage locations isolated from each other. Since the two storage locations of each of the memory cells 10 are isolated from each other and the region for storage (also referred to as a capture region) is very small, the second bit effect can be improved.

The patterned conductor layer 132 is extended along the second direction and covers a portion of the stacked structures 126 extended along the second direction and a portion of the doped region 128 of the second conductivity type. The dielectric layer 130 is located between the patterned conductor layer 132 and the stacked structures 126 and between the patterned conductor layer 132 and the doped region 128 of the second conductivity type.

The two doped regions 115 of the first conductivity type are extended along the first direction and disposed in the substrate 100, and are located below two corresponding stacked structures 126. In an embodiment, one of the two doped regions 115 of the first conductivity type (such as the left side) is used as a source region and the other one of the two doped regions 115 of the first conductivity type (such as the right side) is used as a drain region.

The doped region 128 of the second conductivity type is extended along the first direction and disposed in the substrate 100, and is located between two adjacent doped regions 115 of the first conductivity type. The surface of the doped region 128 of the second conductivity type can be used as a channel. A portion of the doped region 128 of the second conductivity type is overlapped with a portion of the stacked structures 126.

The isolation structure 112 is disposed in the substrate 100 and located below the doped regions 115 of the first conductivity type and the doped region 128 of the second conductivity type. The isolation structure 112 is in the substrate 100 and extended along the plane formed by the first direction and the second direction, and completely covers a bottom surface 115a of each of the doped regions 115 of the first conductivity type and a bottom surface 128a of the doped region 128 of the second conductivity type. In other words, a top surface 112a of the isolation structure 112 is in direct contact with the bottom surface 115a of each of the doped regions 115 of the first conductivity type, and the top surface 112a of the isolation structure 112 is in direct contact with the bottom surface 128a of the doped region 128 of the second conductivity type. The thickness of the isolation structure 112 is, for instance, 30 angstroms to 1000 angstroms.

Since the isolation structure 112 is in direct contact with the bottom surface 115a of each of the doped regions 115 of the first conductivity type and the bottom surface 128a of the doped region 128 of the second conductivity type and since the isolation structure 112 has sufficient thickness, the travelling path of an electron from the doped region 128 (channel) of the second conductivity type of the present memory cell 10 along the substrate 100 below the doped regions 115 (the source region or the drain region) of the first conductivity type to the charge trapping layer of an adjacent memory cell through a channel of the adjacent memory cell can be effectively blocked. As a result, program disturbance can be effectively prevented.

FIG. 2A to FIG. 2E are schematic cross-sectional diagrams of a manufacturing process of a non-volatile memory device illustrated according to the second embodiment of the invention. The manufacturing process of the semiconductor device of FIG. 2A to FIG. 2E is similar to the manufacturing process of the non-volatile memory device of FIG. 1A to FIG. 1E, and therefore the same elements are represented by the same labels and are not repeated herein.

Figure 2A:
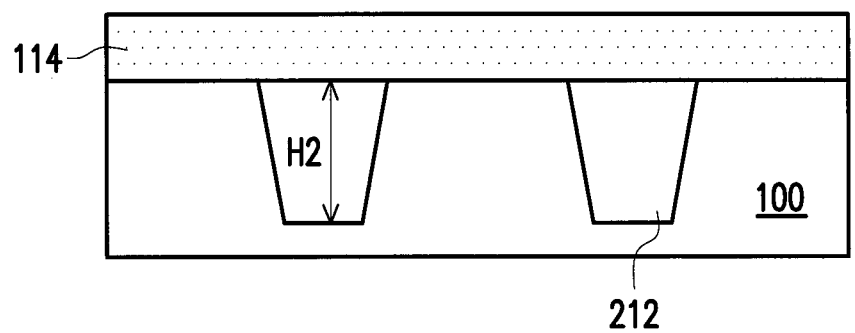
FIG. 2A to FIG. 2E are schematic cross-sectional diagrams of a manufacturing process of a non-volatile memory device illustrated according to the second embodiment of the invention.
Figure 2B:
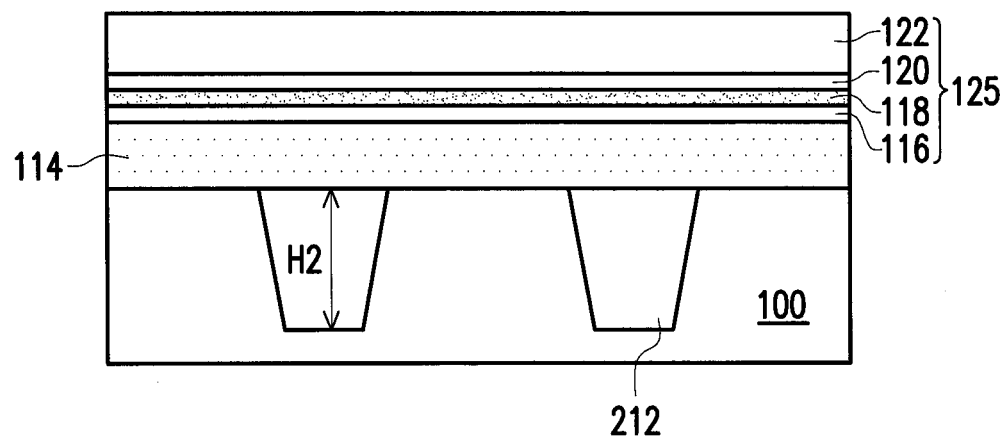
Figure 2C:
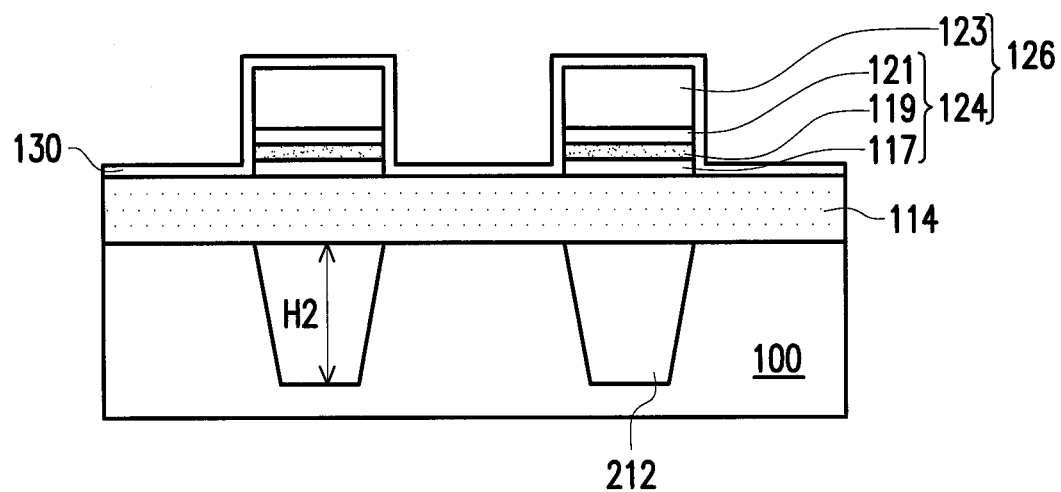
Figure 2D:
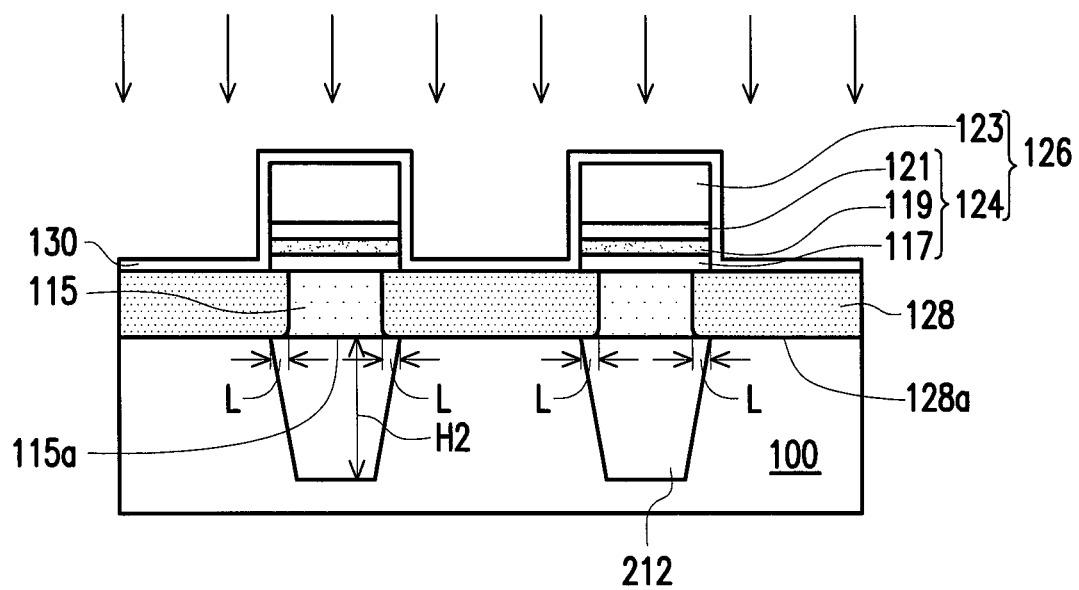

First, referring to FIG. 2A, a plurality of isolation structures 212 are formed in a substrate 100. In the figure, only two isolation structures 212 are illustrated. A depth H2 of each of the isolation structures 212 is, for instance, 500 angstroms to 3000 angstroms. The material of the isolation structures 212 is, for instance, any suitable material such as silicon oxide, silicon oxynitride, silicon carbide, or silicon carbon nitride.

The forming method of the isolation structures 212 is, for instance, a shallow trench isolation method or a deep trench isolation method.

Then, referring to FIGS. 2B to 2E, a plurality of doped regions 115 of the first conductivity type, a plurality of doped regions 128 of the second conductivity type, a plurality of stacked structures 126, a dielectric layer 130, and a gate conductor layer 132 are formed on a substrate 100 according to the method above to form a memory cell 20.

Figure 2E:
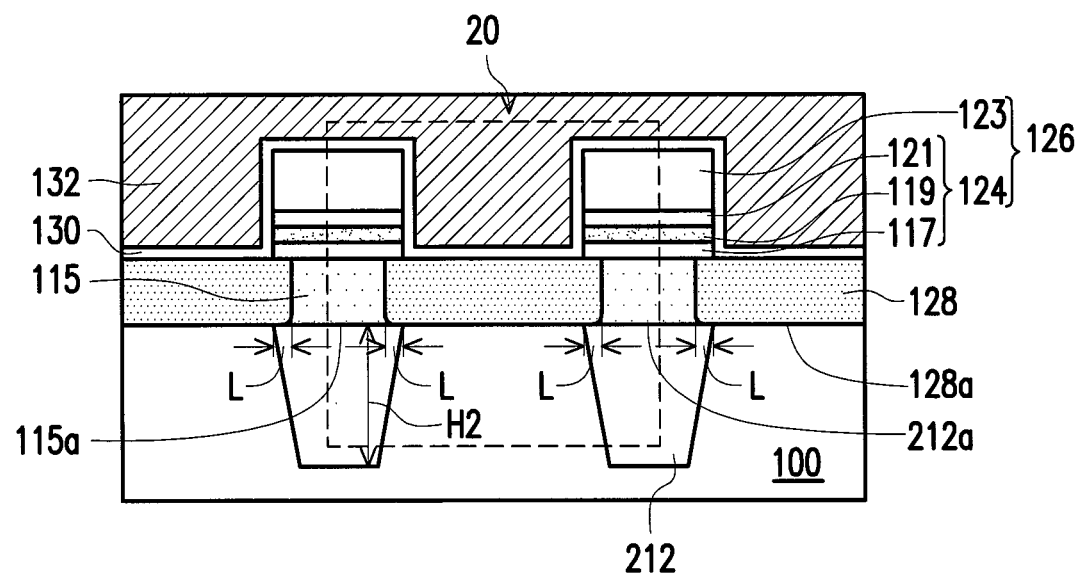

Referring to FIG. 2E, the memory cell 20 of the invention includes a plurality of memory cells 20 located on the substrate 100. Each of the memory cells 20 includes a gate conductor layer 132, a dielectric layer 130, two stacked structures 126, two doped regions 115 of the first conductivity type, one doped region 128 of the second conductivity type, and two isolation structures 212.

The difference between the memory cell 20 of the second embodiment and the memory cell 10 of the first embodiment is that the second embodiment includes two isolation structures 212 separated from each other. Therefore, only the isolation structures 212 are described in detail herein, and the other structural members are as described in the first embodiment.

Each of the isolation structures 212 is extended along the first direction and disposed in the substrate 100 below the doped regions 115 of the first conductivity type. Each of the isolation structures 212 illustrated in the figures is disposed directly below the stacked structures 126. However, the invention is not limited thereto, and the isolation structures 212 can also not be located directly below the stacked structures 126. The top surface 212a of the isolation structure 212 is in direct contact with the bottom surface 115a of each of the doped regions 115 of the first conductivity type, and the top surface 212a of each of the isolation structures 212 is in direct contact with the bottom surface 128a of the doped region 128 of the second conductivity type. A length L of the portion at which the top surface 212a of each of the isolation structures 112 is in direct contact with the bottom surface 128a of the doped region 128 of the second conductivity type is, for instance, 30 angstroms to 100 angstroms. A depth H2 of each of the isolation structures 212 is, for instance, 500 angstroms to 3000 angstroms.

Since the isolation structures 212 are in direct contact with the bottom surface 115a of each of the doped regions 115 of the first conductivity type and the bottom surface 128a of the doped region 128 of the second conductivity type, and since each of the isolation structures 212 has sufficient depth, program disturbance can be effectively prevented.

FIG. 3A to FIG. 3F are schematic cross-sectional diagrams of a manufacturing process of a non-volatile memory device illustrated according to the third embodiment of the invention. The manufacturing process of the semiconductor device of FIG. 3A to FIG. 3F is similar to the manufacturing process of the non-volatile memory device of FIG. 1A to FIG. 1E, and therefore the same elements are represented by the same labels and are not repeated herein.

Figure 3A:
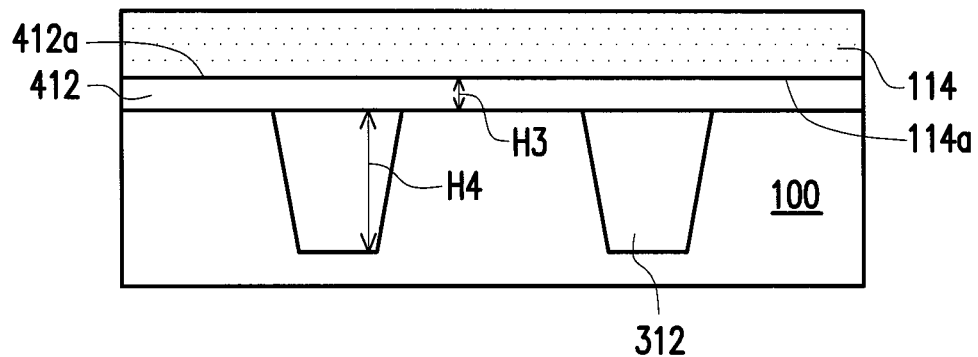
FIG. 3A to FIG. 3F are schematic cross-sectional diagrams of a manufacturing process of a non-volatile memory device illustrated according to the third embodiment of the invention.

First, referring to FIG. 3A, isolation structures 312 are formed in a substrate 100. The material of the isolation structures 312 is, for instance, any suitable material such as silicon oxide, silicon oxynitride, silicon carbide, or silicon carbon nitride. A depth H4 of each of the isolation structures 312 is, for instance, 500 angstroms to 3000 angstroms. The forming method of the isolation structures 312 is, for instance, a shallow trench isolation method or a deep trench isolation method.

Figure 3B:
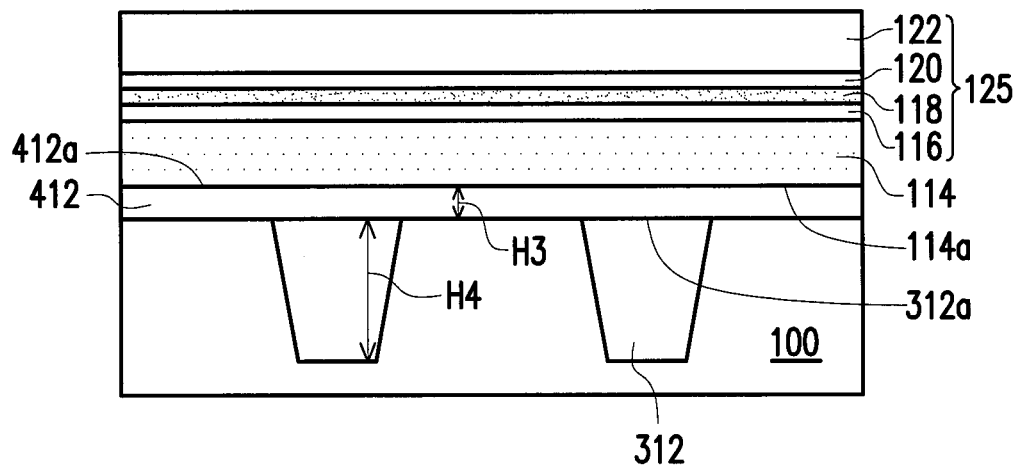
Figure 3C:
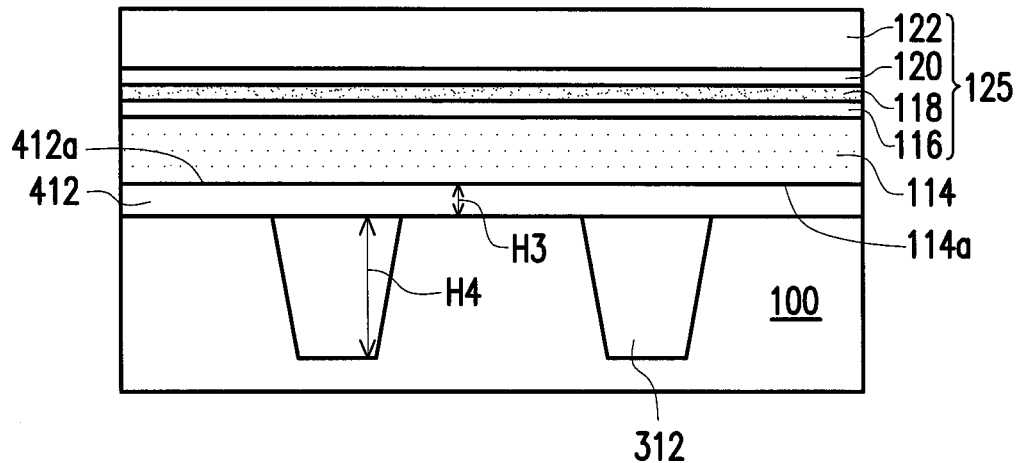
Figure 3D:
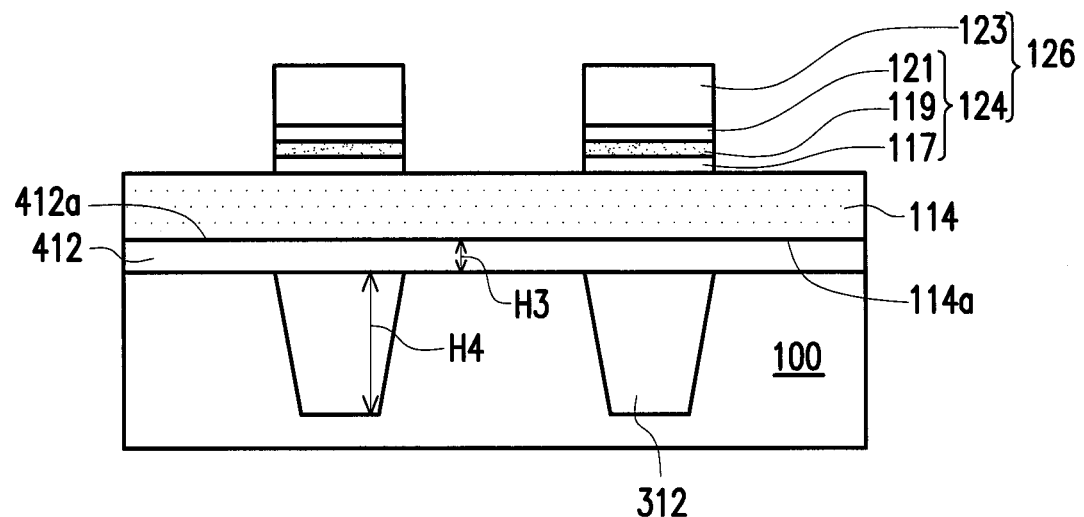
Figure 3E:
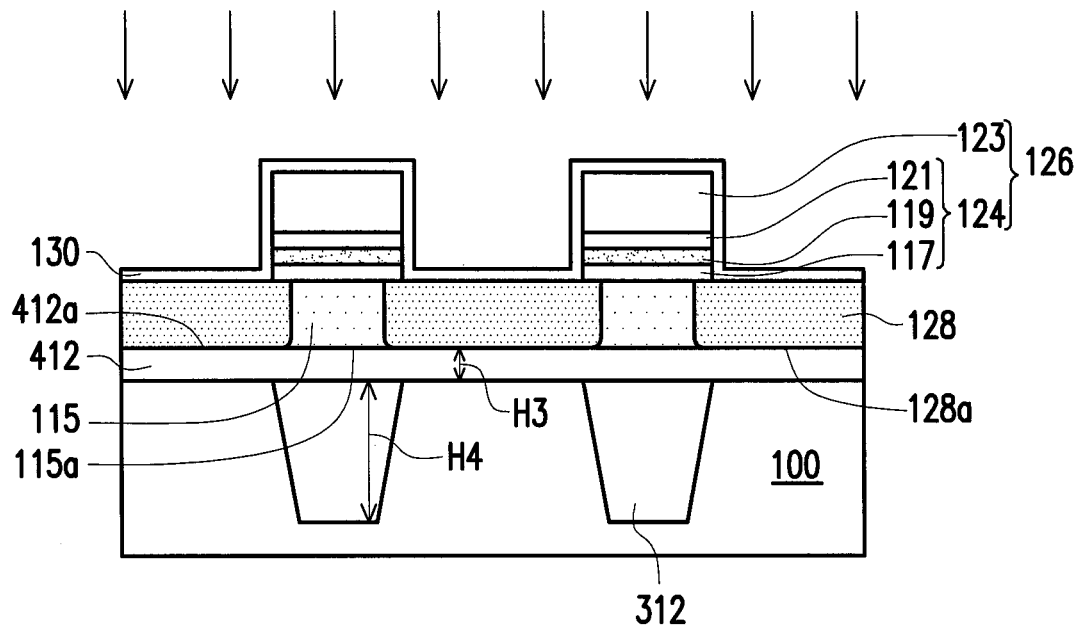

Then, referring to FIG. 3B, an isolation structure 412 is formed on the isolation structures 312. The material of the isolation structure 412 is, for instance, any suitable material such as silicon oxide, silicon oxynitride, silicon oxynitride, silicon carbide, or silicon carbon nitride. A thickness H3 of the isolation structure 412 is, for instance, 30 angstroms to 1000 angstroms. The forming method of the isolation structure 412 is, for instance, a chemical vapor deposition method.

Then, referring to FIGS. 3C to 3F, a gate conductor layer 132, a dielectric layer 130, a plurality of stacked structures 126, a plurality of doped regions 115 of the first conductivity type, and a plurality of doped regions 128 of the second conductivity type are formed on the substrate 100 according to the method above.

Figure 3F:
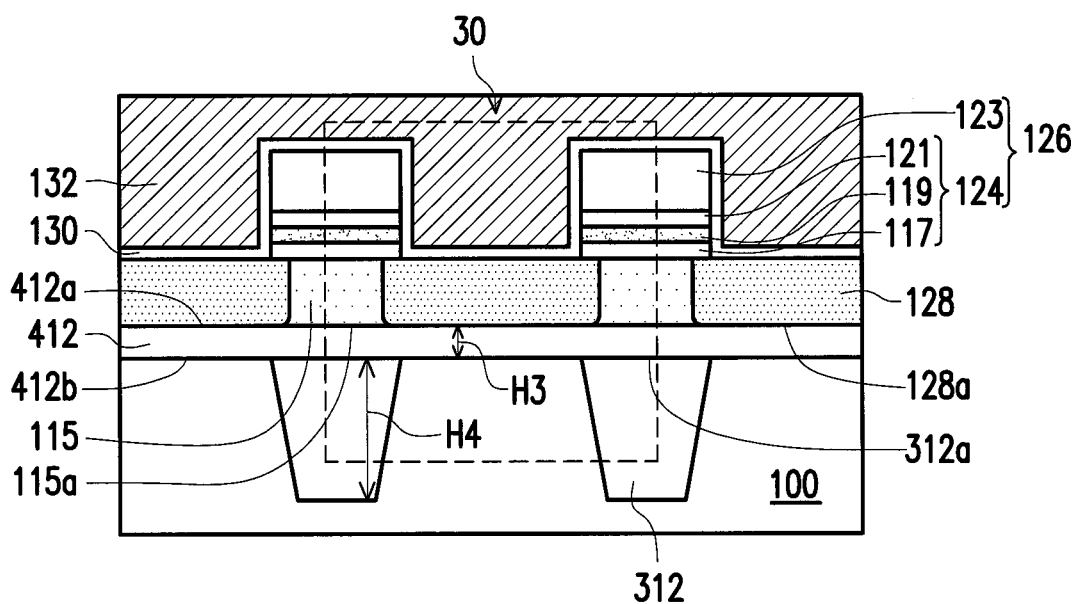

Referring to FIG. 3F, a memory cell 30 of the invention includes a plurality of memory cells 30 located on the substrate 100. Each of the memory cells 30 includes: a gate conductor layer 132, a dielectric layer 130, two stacked structures 126, two doped regions 115 of the first conductivity type, one doped region 128 of the second conductivity type, two isolation structures 312, and one isolation structure 412.

The difference between the memory cell 30 of the third embodiment and the memory cell 10 of the first embodiment is that the third embodiment includes two isolation structures 312 and one isolation structure 412. Therefore, only the isolation structures 312 and 412 are described in detail herein, and the other structural members are as described in the first embodiment.

The two isolation structures 312 are separated from each another. Each of the isolation structures 312 is extended along the first direction and disposed in the substrate 100 below the doped regions 115 of the first conductivity type. Each of the isolation structures 312 illustrated in the figures is disposed directly below the stacked structures 126. However, the invention is not limited thereto, and the isolation structures 312 can also not be located directly below the stacked structures 126. A depth H4 of each of the isolation structures 312 is, for instance, 500 angstroms to 3000 angstroms.

The isolation structure 412 is located in the substrate 100 and located below the doped regions 115 of the first conductivity type and the doped region 128 of the second conductivity type. The isolation structure 412 is in the substrate 100 and extended along the plane formed by the first direction and the second direction, and completely covers the bottom surface 115a of each of the doped regions 115 of the first conductivity type and the bottom surface 128a of the doped region 128 of the second conductivity type. In other words, a top surface 412a of the isolation structure 412 is in direct contact with the bottom surface 115a of each of the doped regions 115 of the first conductivity type, and the top surface 412a of the isolation structure 412 is in direct contact with the bottom surface 128a of the doped region 128 of the second conductivity type. A bottom surface 412b of the isolation structure 412 is in direct contact with a top surface 312a of each of the isolation structures 312. A depth H3 of the isolation structure 412 is, for instance, 500 angstroms to 3000 angstroms.

Since the isolation structure 412 is in direct contact with the bottom surface 115a of each of the doped regions 115 of the first conductivity type and the bottom surface 128a of the doped region 128 of the second conductivity type, and since each of the isolation structures 312 has sufficient depth, program disturbance can be effectively prevented.

Based on the above, in the embodiments of the invention, since two storage locations of each of the memory cells are isolated from each other and the region for storage (also referred to as a trapping region) is very small, the second bit effect can be reduced. Moreover, since an isolation structure is disposed below the doped regions of the first conductivity type and the doped region of the second conductivity type such that the isolation structure is in direct contact with the doped regions of the first conductivity type and the doped region of the second conductivity type, the isolation structure can effectively block the travelling path of an electron in a charge trapping layer moving below a source region or a drain region from a channel of the original memory cell and entering a charge trapping layer of an adjacent memory cell. As a result, program disturbance can be effectively prevented. Moreover, the manufacturing process of a memory cell of the embodiments of the invention does not require an excess number of additional process steps and can be integrated with a current manufacturing process to manufacture a memory cell capable of reducing the issues of the second bit effect or program disturbance. As a result, the manufacturing method and the memory cell of the invention are beneficial to the industry.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory cell, comprising:
   a substrate;
   two doped regions of a first conductivity type respectively disposed in the substrate, wherein one of the two doped regions of the first conductivity type is used as a source region and the other one of the two doped regions of the first conductivity type is used as a drain region;
   a doped region of a second conductivity type disposed in the substrate between the two doped regions of the first conductivity type;
   two stacked structures disposed on the substrate and respectively covering the corresponding doped regions of the first conductivity type and a portion of the doped region of the second conductivity type, wherein each of the stacked structures comprises a charge storage layer; and
   a first isolation structure completely covering and in contact with a bottom surface of each of the doped regions of the first conductivity type and a bottom surface of the doped region of the second conductivity type.

2. The memory cell of claim 1, further comprising two second isolation structures located below the first isolation structure and respectively disposed in the substrate below the doped regions of the first conductivity type and at least a portion of the doped region of the second conductivity type.

3. The memory cell of claim 1, further comprising:
   a patterned gate conductor layer covering a surface and a sidewall of each of the stacked structures and a surface of the doped region of the second conductivity type; and
   a dielectric layer located between the patterned gate conductor layer and the stacked structures and between the patterned gate conductor layer and the doped region of the second conductivity type.

4. The memory cell of claim 1, wherein each of the charge trapping layers covering the portion of the doped region of the second conductivity type is used as a storage location.

5. The memory cell of claim 1, wherein each of the stacked structures comprises a first dielectric layer, the charge trapping layer, a second dielectric layer, from bottom to top.

6. The memory cell of claim 5, wherein each of the stacked structures further comprises a hard mask layer on the second dielectric layer.

7. A memory cell, comprising:

a substrate;

two doped regions of a first conductivity type respectively disposed in the substrate, wherein one of the two doped regions of the first conductivity type is used as a source region and the other one of the two doped regions of the first conductivity type is used as a drain region;

a doped region of a second conductivity type disposed in the substrate between the two doped regions of the first conductivity type;

two stacked structures disposed on the substrate and respectively covering the corresponding doped regions of the first conductivity type and a portion of the doped region of the second conductivity type, wherein each of the stacked structures comprises a charge storage layer; and two isolation structures respectively disposed in the substrate and located below the doped regions of the first conductivity type and at least a portion of the doped region of the second conductivity type, wherein the isolation structures are in contact with a bottom surface of each of the doped regions of the first conductivity type and in contact with a bottom surface of the doped region of the second conductivity type.

8. The memory cell of claim 7, further comprising:

a patterned gate conductor layer covering a surface and a sidewall of each of the stacked structures and a surface of the doped region of the second conductivity type; and a dielectric layer located between the patterned gate conductor layer and the stacked structures and between the patterned gate conductor layer and the doped region of the second conductivity type.

9. The memory cell of claim 7, wherein each of the charge trapping layers covering the portion of the doped region of the second conductivity type is used as a storage location.

10. The memory cell of claim 7, wherein each of the stacked structures comprises a first dielectric layer, the charge trapping layer, a second dielectric layer, from bottom to top.

11. The memory cell of claim 10, wherein each of the stacked structures further comprises a hard mask layer on the second dielectric layer.

12. A manufacturing method of a memory cell, comprising:

forming an isolation structure on a substrate;

forming a doped layer of a first conductivity type on the isolation structure;

forming two stacked structures on the doped layer of the first conductivity type, wherein each of the stacked structures comprises a charge storage layer; and forming a doped region of a second conductivity type in the doped layer of the first conductivity type, wherein the doped region of the second conductivity type divides the doped layer of the first conductivity type into two doped regions of the first conductivity type, wherein the isolation structure is disposed in the substrate below the doped regions of the first conductivity type and at least a portion of the doped region of the second conductivity type, and the isolation structure is in contact with a bottom surface of each of the doped regions of the first conductivity type and in contact with a bottom surface of the at least a portion of the doped region of the second conductivity type;

wherein one of the two doped regions of the first conductivity type is used as a source region and the other one of the two doped regions of the first conductivity type is used as a drain region;

wherein the two stacked structures disposed on the substrate and respectively covering the corresponding doped regions of the first conductivity type and a portion of the doped region of the second conductivity type.

13. The method of claim 12, wherein the step of forming the isolation structure on the substrate comprises forming a first isolation structure such that the bottom surface of each of the doped regions of the first conductivity type and the bottom surface of the doped region of the second conductivity type are in contact with the first isolation structure.

14. The method of claim 12, wherein the step of forming the isolation structure on the substrate further comprises forming two second isolation structures corresponding to the doped regions of the first conductivity type and located in the substrate below the first isolation structure.

15. The method of claim 12, wherein the isolation structure comprises two first isolation structures corresponding to the doped regions of the first conductivity type.

16. The method of claim 12, further comprising:

forming a gate conductor layer covering a surface and a sidewall of each of the stacked structures and a surface of the doped region of the second conductivity type; and forming a dielectric layer located between the gate conductor layer and the stacked structures and between the gate conductor layer and the doped region of the second conductivity type.

17. The method of claim 12, wherein a forming method of the isolation structure comprises a chemical vapor deposition method, a thermal oxidation method, a shallow trench isolation method, or a combination thereof.

18. The method of claim 12, wherein each of the two stacked structures comprises a first dielectric layer, the charge trapping layer, a second dielectric layer and a hard mask layer, from bottom to top.

* * * * *